US008379404B2

(12) United States Patent
Qiu et al.

(10) Patent No.: US 8,379,404 B2
(45) Date of Patent: Feb. 19, 2013

(54) SLIDE BUTTON AND ELECTRONIC DEVICE USING THE SAME

(75) Inventors: Ji-Feng Qiu, Shenzhen (CN); Hong Li, Shenzhen (CN); Xiao-Hui Zhou, Shenzhen (CN); Hai-Tao Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 75 days.

(21) Appl. No.: 13/073,973

(22) Filed: Mar. 28, 2011

(65) Prior Publication Data

US 2012/0162940 A1 Jun. 28, 2012

(30) Foreign Application Priority Data

Dec. 27, 2010 (CN) .......................... 2010 1 0607384

(51) Int. Cl.
*H05K 7/00* (2006.01)
*H01H 3/20* (2006.01)
*H01H 17/00* (2006.01)

(52) U.S. Cl. ........................................ 361/781; 200/331

(58) Field of Classification Search .................. 361/752, 361/781, 748; 200/331
See application file for complete search history.

(56) References Cited

U.S. PATENT DOCUMENTS

| | | | | |
|---|---|---|---|---|
| 7,115,827 | B2 * | 10/2006 | Tseng | 200/341 |
| 7,439,997 | B2 * | 10/2008 | Van Brocklin | 347/224 |
| 7,652,216 | B2 * | 1/2010 | Sharrah et al. | 200/1 B |
| 7,777,145 | B2 * | 8/2010 | Burrell et al. | 200/330 |
| 7,837,344 | B2 * | 11/2010 | Altonen et al. | 362/85 |
| 7,880,100 | B2 * | 2/2011 | Sharrah et al. | 200/1 B |
| 7,990,731 | B2 * | 8/2011 | Guo et al. | 361/753 |
| 2008/0029379 | A1 * | 2/2008 | Guo | 200/547 |
| 2008/0245646 | A1 * | 10/2008 | Gordon et al. | 200/5 A |
| 2009/0079705 | A1 * | 3/2009 | Sizelove et al. | 345/173 |
| 2009/0133998 | A1 * | 5/2009 | Heerlein et al. | 200/336 |
| 2010/0108485 | A1 * | 5/2010 | Eckert | 200/344 |
| 2010/0175973 | A1 * | 7/2010 | Mathew et al. | 200/339 |
| 2010/0258418 | A1 * | 10/2010 | Yu | 200/314 |
| 2011/0132735 | A1 * | 6/2011 | Iordache | 200/314 |
| 2011/0143835 | A1 * | 6/2011 | Sizelove | 463/31 |

* cited by examiner

*Primary Examiner* — Lisa Lea Edmonds
*Assistant Examiner* — Xanthia C Cunningham
(74) *Attorney, Agent, or Firm* — Altis Law Group, Inc.

(57) ABSTRACT

An exemplary electronic device includes a shell, a circuit board located in an inner side of the shell, a toggle switch positioned on the circuit board, and a slide button. The toggle switch includes a pin. The shell defines a through hole therein. The slide button includes an operating portion located at an outer side of the shell, a curved body extending obliquely from a side of the operating portion. The body of the slide button extends through the through hole of the shell. A distal end of the body of the slide button engages with the pin of the toggle switch. The pin of the toggle switch can be caused to move by moving the slide button.

12 Claims, 3 Drawing Sheets

SLIDE BUTTON AND ELECTRONIC DEVICE USING THE SAME

BACKGROUND

1. Technical Field

The disclosure relates to electronic devices, and particularly to a slide button of an electronic device which can conveniently control a toggle switch in the electronic device.

2. Description of Related Art

An electronic device, such as a DVD (Digital Video Disc) player, generally includes a casing, a circuit board positioned in the casing, and a toggle switch positioned on the circuit board. The toggle switch in the casing is controlled by operating a slide button which extends through a through hole of the casing to engage with a pin of the toggle switch. However, in some electronic devices, the through hole of the casing is not in alignment with the toggle switch. The slide button can not directly engage with the pin of the toggle switch after extending through the through hole, and an additional component is needed to interconnect the pin of the toggle switch and the slide button.

What is needed, therefore, is a slide button of an electronic device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
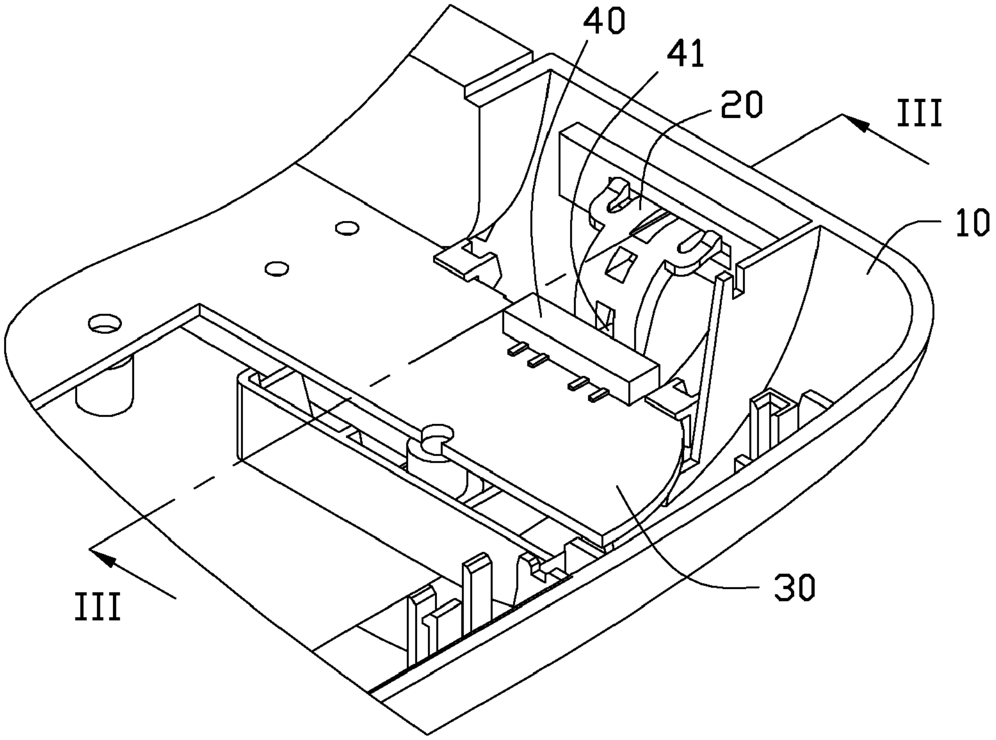
FIG. 1 is an isometric, assembled view of part of an electronic device in accordance with one embodiment of the disclosure.

Referring to FIG. 1, an electronic device in accordance with an embodiment of the disclosure is shown. In this embodiment, the electronic device is a DVD player. The electronic device includes a shell 10, a circuit board 30 positioned in the shell 10, a toggle switch 40 positioned on the circuit board 30, and a slide button 20 extending through the shell 10 and engaging with the toggle switch 40.

Figure 2:
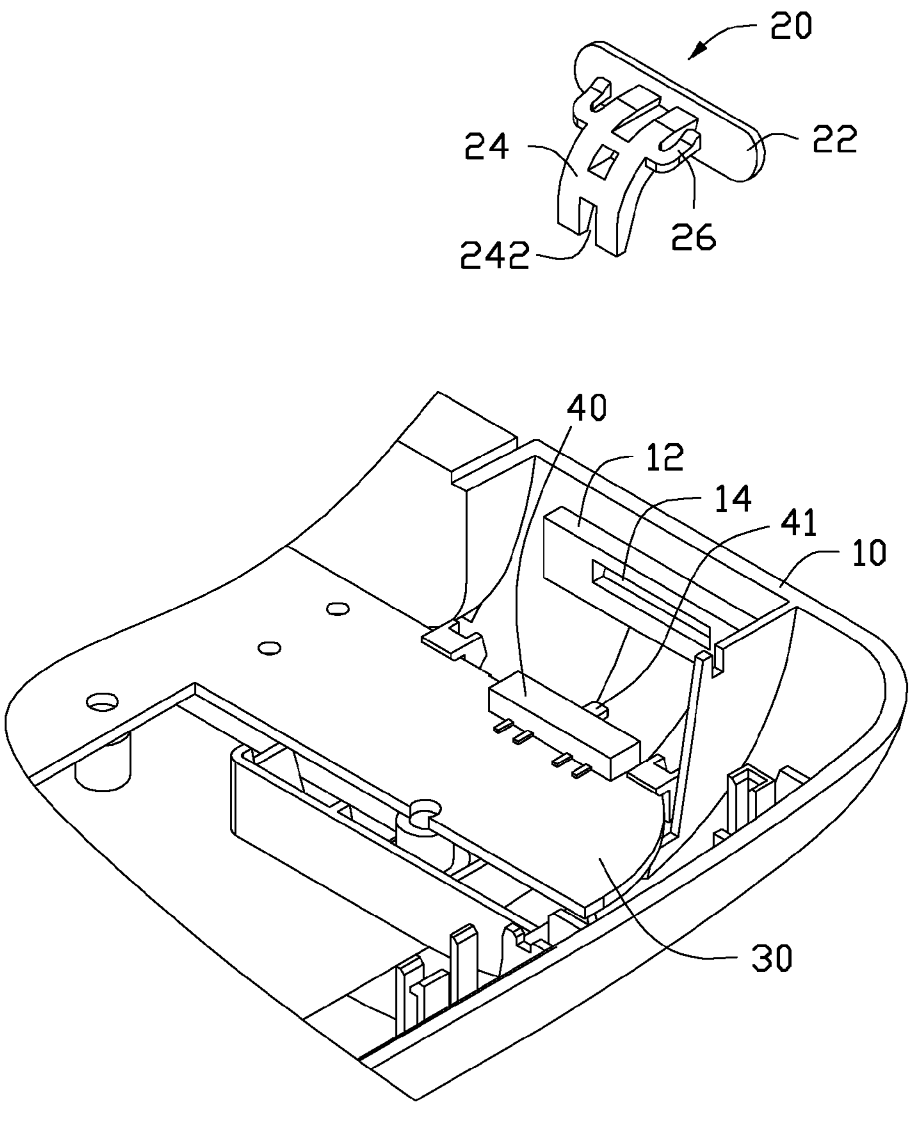
FIG. 2 is an exploded view of the electronic device of FIG. 1.
Figure 3:
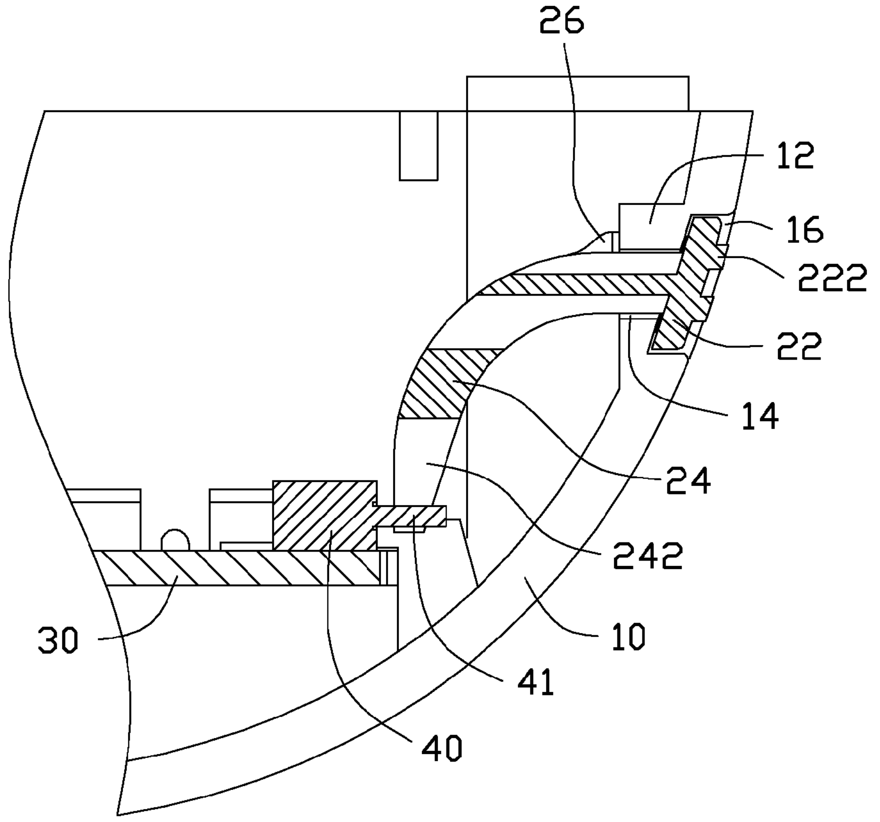
FIG. 3 is a partially cross sectional view of the electronic device of FIG. 1, taken along line III-III thereof.

Also referring to FIGS. 2-3, a pin 41 is positioned at a side of the toggle switch 40. The pin 41 can be moved horizontally from left to right to change states of the electronic device. An elongated protrusion 12 protrudes inwardly from an inner side of the shell 10 towards the toggle switch 40. An elongated through hole 14 is defined in a center of the protrusion 12. An elongated groove 16 is defined in an outer side of the shell 10 corresponding to the protrusion 12. The groove 16 is in communication with the through hole 14. The through hole 14 is higher than the circuit board 30 and the toggle switch 40. That is, the toggle switch 40 and the through hole 14 are located at different levels.

The slide button 20 is integrally formed as a single monolithic piece of the same material, and in this embodiment is made of plastic or metal. The slide button 20 includes an elongated operating portion 22, an arc-shaped body 24 extending slantwise/obliquely and downwardly from a center of a side of the operating portion 22, and two buckling portions 26 extending from two opposite sides of the body 24 towards the operating portion 22. A rectangular cutout 242 is defined in a center of a distal end of the body 24. A distal end of each buckling portion 26 extends upwardly beyond a top of the body 24. A length of the operating portion 22 is shorter than that of the groove 16 of the shell 10. Thereby, after the operating portion 22 is assembled into the groove 16, the operating portion 22 can move along horizontal directions along the groove 16. A plurality of projections (or knurls) 222 extend outward from another opposite side of the operating portion 22, to increase a friction capability of a surface of the operating portion 22 and thereby facilitate operation of the slide button 20 by a user.

The body 24 of the slide button 20 extends through the through hole 14 into the shell 10. Since the body 24 of the slide button 20 extends slantwise and downwardly, the pin 41 of the toggle switch 40 on the circuit board 30 can extend through the cutout 242 of the body 24 of the slide button 20 without other additional component. The two buckling portions 26 deform elastically when the body 24 is extended through the through hole 14 of the shell 10, and then the buckling portions 26 rebound to their original undeformed states and abut against the protrusion 12 of the shell 10 to keep the slide button 20 on the shell 10. The slide button 20 moves horizontally from left to right by pushing the operating portion 22, and this makes the pin 41 of the toggle switch 40 move horizontally from left to right so as to change a state of the electronic device.

According to the disclosure, the toggle switch 40 in the shell 10 of the electronic device can be controlled by the slide button 20 positioned at the shell 10. Since the body 24 of the slide button 20 extends slantwise, even if the through hole 14 of the shell 10 and the toggle switch 40 are located at different levels, the slide button 20 can still control the toggle switch 40 in the shell 10 directly.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic device comprising:

a shell defining a through hole therein;

a circuit board located in the shell;

a toggle switch positioned on the circuit board and comprising a pin; and a slide button comprising:

an operating portion mounted in the through hole of the shell;

a curved body extending obliquely from a side of the operating portion through the through hole into the shell; and two buckling portions extending from two opposite sides of the body towards the operating portion, wherein a distal end of each buckling portion extends upwardly beyond a top of the body, a distal end of the body engages with the pin of the toggle switch, and the pin of the toggle switch is movable according to movement of the slide button.

2. The electronic device of claim 1, wherein the electronic device is a digital video disc player.

3. The electronic device of claim 1, wherein a cutout is defined in the distal end of the body, the pin of the toggle switch extending through the cutout of the body.

4. The electronic device of claim 1, wherein a plurality of projections extend outward from another opposite side of the operating portion.

5. The electronic device of claim 1, wherein a protrusion protrudes from an inner side of the shell towards the toggle switch on the circuit board, and the through hole of the shell is defined in a center of the protrusion.

6. The electronic device of claim 5, wherein a groove is defined in an outer side of the shell corresponding to the protrusion, the groove being in communication with the through hole, the operating portion of the slide button being received in the groove of the shell.

7. The electronic device of claim 1, wherein the slide button is integrally formed as a single piece and made of plastic or metal.

8. A slide button of an electronic device, the slide button comprising:
- an operating portion for operating of the slide button by a user;
- a curved body extending obliquely from a side of the operating portion, the body being adapted for engaging with a pin of a toggle switch of the electronic device such that the pin of the toggle switch is movable according to movement of the slide button; and
- two buckling portions extending from two opposite sides of the body towards the operating portion, a distal end of each buckling portion extending upwardly beyond a top of the body.

9. The slide button of claim 8, wherein a cutout is defined in the body, the cutout adapted for the pin of the toggle switch to extend through.

10. The slide button of claim 8, wherein a plurality of projections extend outward from another opposite side of the operating portion.

11. The slide button of claim 8, wherein the slide button is integrally formed as a single piece and made of plastic or metal.

12. An electronic device comprising:
- a shell defining a through hole therein;
- a circuit board located in the shell;
- a toggle switch positioned on the circuit board and comprising a pin, the toggle switch slidable along a straight path; and
- a slide button comprising:
  - an operating portion mounted in the through hole of the shell;
  - a curved body extending obliquely from a side of the operating portion through the through hole into the shell; and
  - two buckling portions extending from two opposite sides of the body towards the operating portion, a distal end of each buckling portion extending upwardly beyond a top of the body, and a distal end of the body engaging with the pin of the toggle switch such that the pin of the toggle switch drives sliding of the toggle switch according to sliding of the slide button when the slide button is operated by a user.

* * * * *